United States Patent
Culver et al.

(10) Patent No.: US 6,890,627 B2
(45) Date of Patent: May 10, 2005

(54) LASER THERMAL TRANSFER FROM A DONOR ELEMENT CONTAINING A HOLE-TRANSPORTING LAYER

(75) Inventors: Myron W. Culver, Rochester, NY (US); Lee W. Tutt, Webster, NY (US); Mitchell S. Burberry, Webster, NY (US); Ching W. Tang, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 82 days.

(21) Appl. No.: 10/211,213

(22) Filed: Aug. 2, 2002

(65) Prior Publication Data

US 2004/0028942 A1 Feb. 12, 2004

(51) Int. Cl.$^7$ ............................. B32B 9/00; H05B 33/10
(52) U.S. Cl. .................... 428/195.1; 428/332; 428/690; 428/917; 428/913; 428/914; 313/504; 313/506; 427/66; 430/200; 430/319
(58) Field of Search ................................ 428/690, 917, 428/195.1, 332, 913, 914; 313/504, 506; 427/66; 430/200, 319

(56) References Cited

U.S. PATENT DOCUMENTS

| | | |
|---|---|---|
| 3,180,730 A | 4/1965 | Klupfel et al. |
| 3,567,450 A | 3/1971 | Brantly et al. |
| 3,658,520 A | 4/1972 | Brantly et al. |
| 4,356,429 A | 10/1982 | Tang |
| 4,539,507 A | 9/1985 | VanSlyke et al. |
| 4,720,432 A | 1/1988 | VanSlyke et al. |
| 4,768,292 A | 9/1988 | Manzei |
| 4,769,292 A | 9/1988 | Tang et al. |
| 4,885,221 A | 12/1989 | Tsuneeda |
| 5,059,861 A | 10/1991 | Littman et al. |
| 5,059,862 A | 10/1991 | VanSlyke et al. |
| 5,061,569 A | 10/1991 | VanSlyke et al. |
| 5,141,671 A | 8/1992 | Bryan et al. |
| 5,150,006 A | 9/1992 | VanSlyke et al. |
| 5,151,629 A | 9/1992 | VanSlyke |
| 5,219,703 A * | 6/1993 | Bugner et al. ............... 430/200 |
| 5,276,380 A | 1/1994 | Tang |
| 5,294,870 A | 3/1994 | Tang et al. |
| 5,405,709 A | 4/1995 | Littman et al. |
| 5,484,922 A | 1/1996 | Moore et al. |
| 5,578,416 A | 11/1996 | Tutt |

(Continued)

FOREIGN PATENT DOCUMENTS

| | | |
|---|---|---|
| EP | 0 891 121 | 1/1999 |
| EP | 0 732 868 | 5/2000 |
| EP | 1 009 041 | 6/2000 |
| EP | 1 029 909 | 8/2000 |
| WO | WO 98/55561 | 12/1998 |
| WO | WO 00/18851 | 4/2000 |
| WO | WO 00/57676 | 9/2000 |
| WO | WO 00/70655 | 11/2000 |

OTHER PUBLICATIONS

Handbook of Conductive Molecules and Polymers, vols. 1–4, Nalwas, ed., John Wiley and Sons, Chichester (1997), title page and copyright page.*

Primary Examiner—Dawn Garrett
(74) Attorney, Agent, or Firm—Raymond L. Owens

(57) ABSTRACT

A donor element adapted for use in making an OLED device, includes a donor support substrate; a light-absorbing layer disposed over the substrate which, in response to light, produces heat; an emissive layer disposed over the light-absorbing layer; and a hole-transporting layer disposed over the emissive layer such that when the donor element is positioned in a transfer relationship with the OLED device and when light is absorbed by the light-absorbing layer, heat is produced that causes the vaporization transfer across a gap, of hole-transporting materials and emissive materials to the OLED device.

10 Claims, 3 Drawing Sheets

U.S. PATENT DOCUMENTS

| | | |
|---|---|---|
| 5,593,788 A | 1/1997 | Shi et al. |
| 5,645,948 A | 7/1997 | Shi et al. |
| 5,683,823 A | 11/1997 | Shi et al. |
| 5,688,551 A | 11/1997 | Littman et al. |
| 5,755,999 A | 5/1998 | Shi et al. |
| 5,776,623 A | 7/1998 | Hung et al. |
| 5,851,709 A | 12/1998 | Grande et al. |
| 5,928,802 A | 7/1999 | Shi et al. |
| 5,935,720 A | 8/1999 | Chen et al. |
| 5,935,721 A | 8/1999 | Shi et al. |
| 5,937,272 A | 8/1999 | Tang |
| 5,977,572 A | 11/1999 | Liu et al. |
| 6,020,078 A | 2/2000 | Chen et al. |
| 6,114,088 A | 9/2000 | Wolk et al. |
| 6,140,009 A | 10/2000 | Wolk et al. |
| 6,140,763 A | 10/2000 | Hung et al. |
| 6,194,119 B1 | 2/2001 | Wolk et al. |
| 6,208,075 B1 | 3/2001 | Hung et al. |
| 6,214,520 B1 | 4/2001 | Wolk et al. |
| 6,221,553 B1 | 4/2001 | Wolk et al. |
| 6,610,455 B1 * | 8/2003 | Burberry et al. ............ 430/200 |
| 6,641,859 B1 * | 11/2003 | Long et al. .................... 427/66 |
| 2002/0041976 A1 * | 4/2002 | Anderson et al. ........... 428/690 |
| 2002/0047567 A1 * | 4/2002 | Fujita et al. ............. 315/169.3 |
| 2003/0068525 A1 * | 4/2003 | Bellmann et al. ........... 428/690 |
| 2003/0124265 A1 * | 7/2003 | Bellmann et al. ........... 427/536 |

* cited by examiner

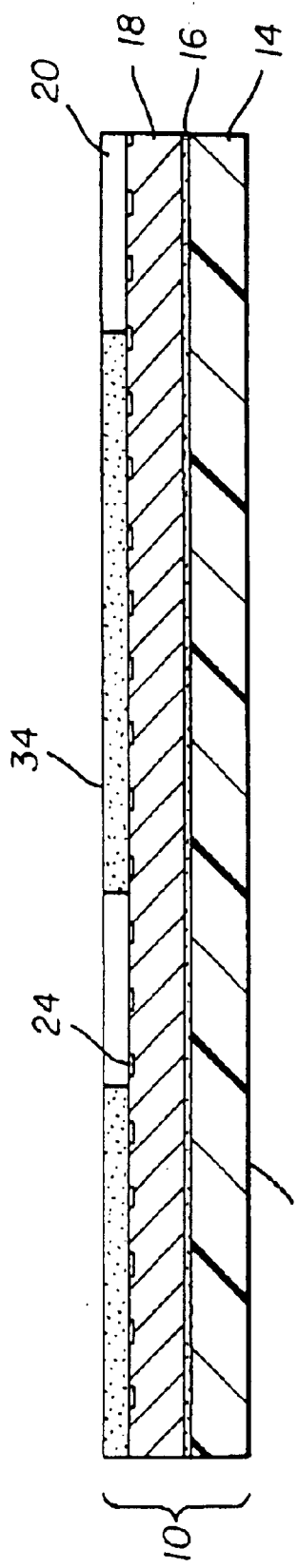
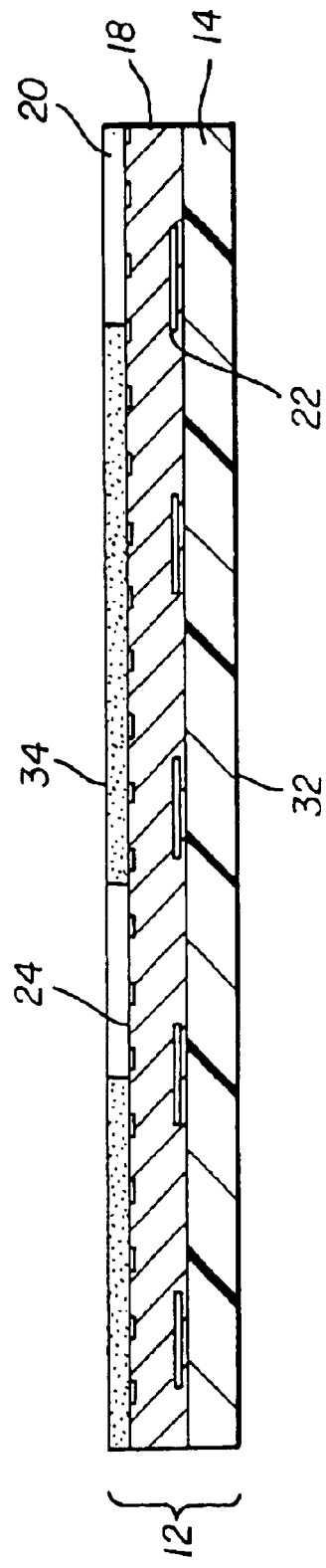
FIG. 1a
FIG. 1b

LASER THERMAL TRANSFER FROM A DONOR ELEMENT CONTAINING A HOLE-TRANSPORTING LAYER

CROSS REFERENCE TO RELATED APPLICATIONS

Reference is made to commonly assigned U.S. patent application Ser. No. 10/060,873 filed Jan. 30, 2002, now abandoned, by Mitchell S. Burberry et al., entitled "Using Spacer Elements to Make Electroluminescent Display Devices"; commonly assigned U.S. patent application Ser. No. 10/021,410 filed Dec. 12, 2001, now U.S. Pat. No. 6,695,029, by Bradley A. Phillips et al., entitled "Apparatus for Permitting Transfer of Organic Material From a Donor to Form a Layer in an OLED Device"; and commonly assigned U.S. patent application Ser. No. 10/210,934 filed Aug. 2, 2002 by Myron W. Culver et al., entitled "Laser Thermal Transfer Donor Including a Separate Dopant Layer", the disclosure of which is incorporated by reference.

FIELD OF THE INVENTION

The present invention relates to organic electroluminscent (EL) devices, also known as organic light-emitting diodes (OLED), and to a donor element and a method of using such donor element for making such OLED devices.

BACKGROUND OF THE INVENTION

In color or full color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole transport layer (for hole transport) or electronic transport layer (for electron transport). In forming the RGB pixels in a full color OLED display panel, it is necessary to devise a method to precisely pattern the emissive layer of the organic EL medium or the entire organic EL medium.

A suitable method for patterning high resolution OLED displays has been disclosed in U.S. Pat. No. 5,851,709 by Grande et al. This method is comprised of the following sequence of steps: 1) providing a substrate having opposing first and second surfaces; 2) forming a light-transmissive heat-insulating layer over the first surface of the substrate; 3) forming a light-absorbing layer over the heat-insulating layer; 4) providing the substrate with an array of openings extending from the second surface to the heat-insulating layer; 5) providing a transferable color forming organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate.

Littman and Tang (U.S. Pat. No. 5,688,551) teach the patternwise transfer of organic EL material from an unpatterned donor sheet to an EL substrate. A series of patents by Wolk et al. (U.S. Pat. Nos. 6,114,088; 6,140,009; 6,214,520; and 6,221,553) teaches a method that can transfer the luminescent layer of an EL device from a donor element to a substrate by heating selected portions of the donor with a laser beam.

In commonly assigned U.S. Pat. No. 5,937,272, Tang has taught a method of patterning multicolor pixels (e.g. red, green, blue subpixels) onto a thin-film-transistor (TFT) array substrate by vapor deposition of an EL material. Such EL material is deposited on a substrate in a selected pattern via the use of a donor coating on a support and an aperture mask. The aperture mask can be a separate entity between the donor layer and substrate (as in FIG. 1 in the aforementioned patent), or can be incorporated into the donor layer (as in FIGS. 4, 5, and 6 in the aforementioned patent).

There is a problem with laser thermal transfer with donors to date in that the OLED device has a lower efficiency and stability of light output than is desired. Degradation of the output intensity occurs over time, which can lead to hue shifts or loss of contrast.

SUMMARY OF THE INVENTION

It is therefore an object of the present invention to increase the efficiency of the radiation-transferred OLED device.

It is further an object of this invention to provide enhanced stability of the light output of the device.

It is a still further object of this invention to provide an improved way of transferring an emissive layer to an OLED device.

These objects are achieved by a donor element adapted for use in making an OLED device, comprising:

a) a donor support element;

b) a light-absorbing layer disposed over the substrate which, in response to light, produces heat;

c) an emissive layer disposed over the light-absorbing layer; and d) a hole-transporting layer disposed over the emissive layer such that when the donor element is positioned in a transfer relationship with the OLED device and when light is absorbed by the light-absorbing layer, heat is produced that causes the vaporization transfer across a gap of hole-transporting materials and emissive materials to the OLED device.

These objects are also achieved by a method of using the donor element discussed immediately above in the process of making an OLED device, comprising the steps of:

a) positioning the donor element in a transfer relationship with an OLED substrate and spaced from such OLED by a gap; and b) illuminating the donor element with light which is sufficient to cause enough heat to be formed such that hole-transporting material and emissive material are respectively deposited on the OLED substrate with the hole-transporting material being mixed into the emissive material at the interface between the hole-transporting and emissive materials.

ADVANTAGES

A donor for laser transfer is made by depositing the emissive layer to be transferred. Deposited on top is a layer of a hole-transporting material. A laser is used to transfer the emissive layer from a donor element to an OLED substrate. The resulting OLED device was found quite unexpectedly to be more efficient and stable than one without the hole-transporting layer.

BRIEF DESCRIPTION OF THE DRAWINGS

FIG. 1a shows one embodiment of the structure of a donor element prepared in accordance with this invention;

FIG. 1b shows another embodiment of the structure of a donor element prepared in accordance with this invention;

Figure 2A:
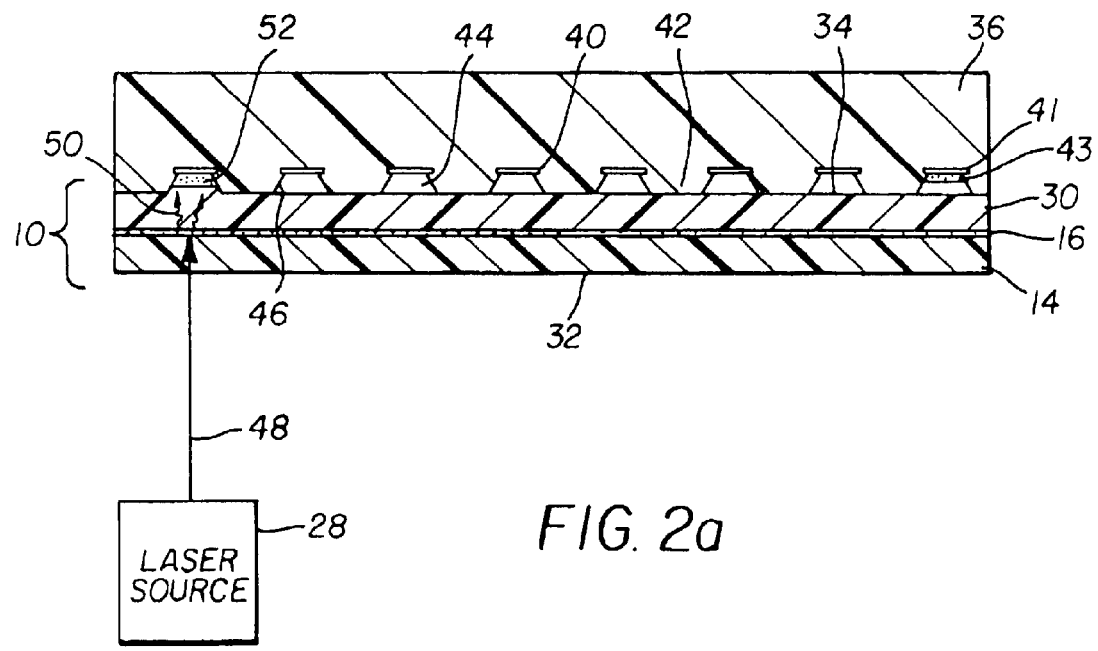
FIG. 2a shows a cross-sectional representation of the transfer of organic material from donor to substrate by one method of treatment with light.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel, which can be independently addressable to emit a specific color. For example, a blue subpixel is that portion of a pixel, which can be addressed to emit blue light. In a full color display, a pixel generally comprises three primary-color subpixels, namely blue, green, and red. The term "pitch" is used to designate the distance separating two pixels or subpixels in a display panel. Thus, a subpixel pitch means the separation between two subpixels.

FIG. 1a shows in cross-sectional view one embodiment of the structure of a donor element 10. Donor element 10 includes at the minimum a flexible donor support substrate 14, which comprises the non-transfer surface 32 of donor element 10. Donor support substrate 14 can be made of any of several materials, which meet at least the following requirements. The donor support substrate must be capable of maintaining the structural integrity during the light-to-heat-induced transfer step while pressurized on one side, and during any preheating steps contemplated to remove volatile constituents such as water vapor. Additionally, the donor support must be capable of receiving on one surface a relatively thin coating of organic donor material, and of retaining this coating without degradation during anticipated storage periods of the coated support. Support materials meeting these requirements include, for example, metal foils, certain plastic foils which exhibit a glass transition temperature value higher than a support temperature value anticipated to cause transfer of the transferable organic donor materials of the coating on the support, and fiber-reinforced plastic foils. While selection of suitable support materials can rely on known engineering approaches, it will be appreciated that certain aspects of a selected support material merit further consideration when configured as a donor support useful in the practice of the invention. For example, the support can require a multistep cleaning and surface preparation process prior to precoating with transferable organic material. If the support material is a radiation-transmissive material, the incorporation into the support or onto a surface thereof, of a radiation-absorptive material can be advantageous to more effectively heat the donor support and to provide a correspondingly enhanced transfer of transferable organic donor material from the support to the substrate, when using a flash of radiation from a suitable flash lamp or laser light from a suitable laser.

Donor support substrate 14 is uniformly coated with a radiation-absorbing layer 16 comprising radiation-absorbing material capable of absorbing light in a predetermined portion of the spectrum to produce heat. Radiation-absorbing material 16 can be a dye such as the dyes specified in U.S. Pat. No. 5,578,416, a pigment such as carbon, or a metal such as nickel, chromium, titanium, etc.

Donor element 10 further includes an emissive layer 18 comprising organic emissive material. Useful organic emissive materials are well known. As more fully described in U.S. Pat. Nos. 4,769,292 and 5,935,721, the emissive layer of the organic EL element comprises a luminescent or fluorescent material where electroluminescence is produced as a result of electron-hole pair recombination in this region. The emissive layer can be comprised of a single material, but more commonly includes a host material doped with a guest compound or dopant where light emission comes primarily from the dopant and can be of any color. The host materials in the emissive layer can be an electron-transporting material, as defined below, a hole-transporting material, as defined below, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

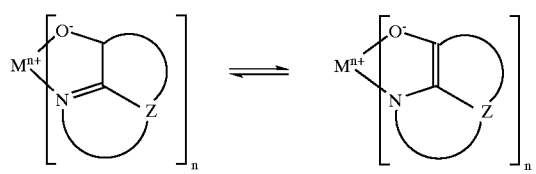

E wherein:

M represents a metal;

n is an integer of from 1 to 3; and

Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function, the number of ring atoms is usually maintained at 18 or less.

Illustrative of useful chelated oxinoid compounds are the following:

CO-1: Aluminum trisoxine [alias, tris(8-quinolinolato) aluminum(III)]

CO-2: Magnesium bisoxine [alias, bis(8-quinolinolato) magnesium(II)]

CO-3: Bis[benzo {f}-8-quinolinolato]zinc (II)

CO-4: Bis(2-methyl-8-quinolinolato)aluminum(III)-$\mu$-oxo-bis(2-methyl-8-quinolinolato) aluminum(III)

CO-5: Indium trisoxine [alias, tris(8-quinolinolato)indium]

CO-6: Aluminum tris(5-methyloxine) [alias, tris(5-methyl-8-quinolinolato) aluminum(III)]

CO-7: Lithium oxine [alias, (8-quinolinolato)lithium(I)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

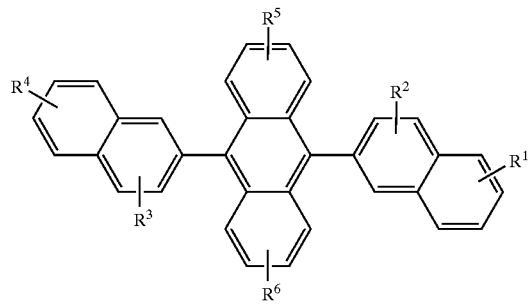

F wherein:

$R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5 alkoxylamino, alkylamino, or arylamino of from 1 to 24 carbon atoms; and Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

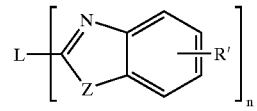

G where:

n is an integer of 3 to 8;

Z is O, NR or S;

R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

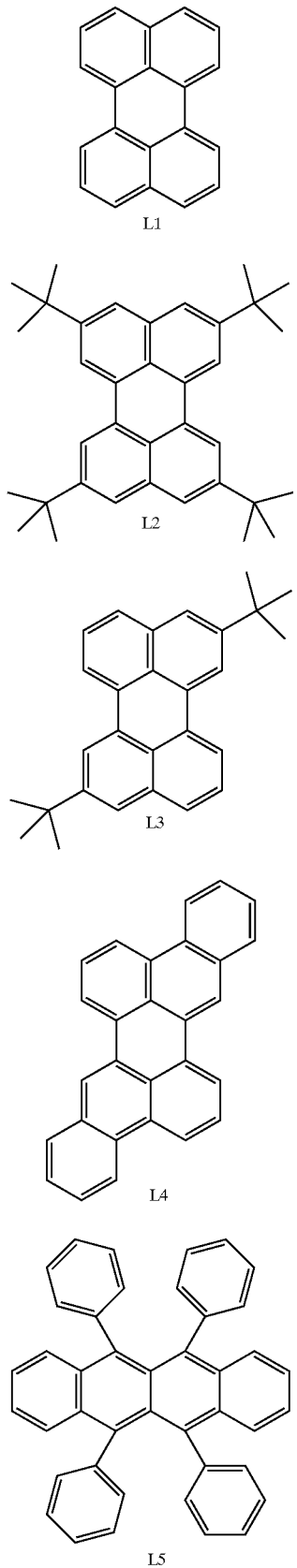
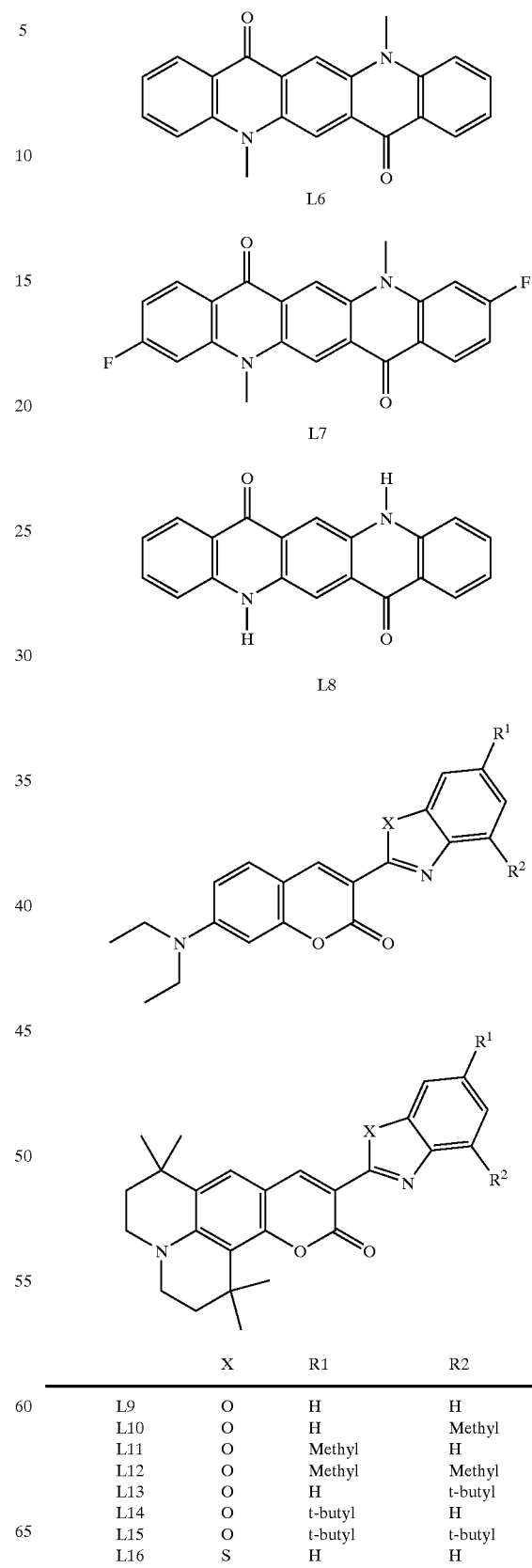
|     | X | R1     | R2     |
| --- | - | ------ | ------ |
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |

| | | | |
|---|---|---|---|
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
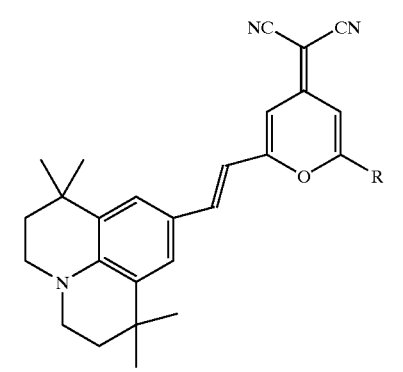
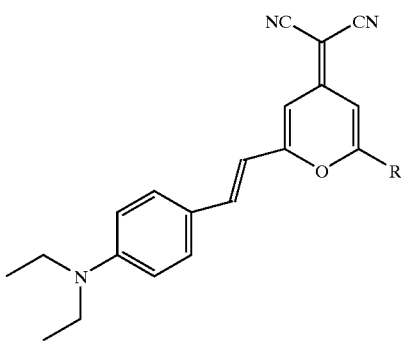
| | R |
|---|---|
| L37 | phenyl |
| L38 | methyl |
| L39 | t-butyl |
| L40 | mesityl |
| L41 | phenyl |
| L42 | methyl |
| L43 | t-butyl |
| L44 | mesityl |
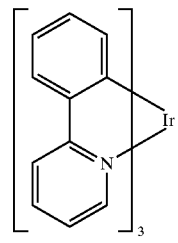
L45
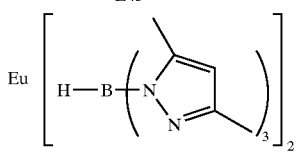
L46
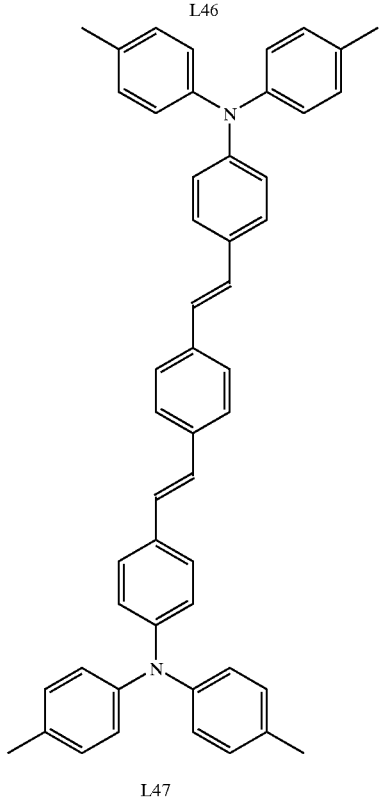
L47
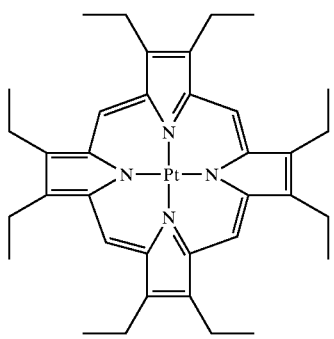
L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references therein.

Although not shown, emissive layer 18 can additionally comprise two or more emissive layers, if such is desired for proper emissive properties of the resulting OLED device.

Donor element 10 further includes a hole-transporting layer 20 comprising hole-transporting material, which is disposed over organic emissive layer 18. Hole-transporting layer 20 can be disposed directly on emissive layer 18, or can be disposed on an intermediate layer. Useful hole-transporting materials are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural formula (A).

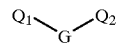

A

Wherein:

$Q_1$ and $Q_2$ are independently selected aromatic tertiary amine moieties; and G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

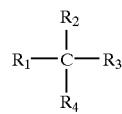

B where:

$R_1$ and $R_2$ each independently represent a hydrogen atom, an aryl group, or an alkyl group or $R_1$ and $R_2$ together represent the atoms completing a cycloalkyl group; and $R_3$ and $R_4$ each independently represent an aryl group, which is in turn substituted with a diaryl substituted amino group, as indicated by structural formula (C):

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

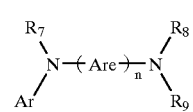

D wherein:

each Are is an independently selected arylene group, such as a phenylene or anthracene moiety;

n is an integer of from 1 to 4; and

Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), (D), can each in turn be substituted. Typical substituents include alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron injecting and transporting layer. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole)
N,N'-di-1-naphthalenyl-N,N'-diphenyl-4,4'-diaminobiphenyl
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene 4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene Another class of useful hole-transporting materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Donor support element 14 thus comprises non-transfer surface 32 and hole-transporting layer 20 comprises transfer surface 34 of donor element 10. The hole-transporting layer thickness is in the range of 0.1 to 5.0 nanometers.

FIG. 1b shows in cross-sectional view another embodiment of the structure of a donor element 12. In this embodiment, donor support substrate 14 is first coated with patterned light-absorbing layer 22 capable of absorbing light in a predetermined portion of the spectrum to produce heat, then coated with organic emissive layer 18, and finally hole-transporting layer 20. Donor support substrate 14 then comprises non-transfer surface 32 and hole-transporting layer 20 comprises transfer surface 34. Patterned light-absorbing layer 22 includes radiation-absorbing material capable of absorbing light in a predetermined portion of the spectrum and producing heat.

FIG. 2a shows a cross-sectional representation of the transfer of organic material 30 from donor element 10 to portions of substrate 36 by one method of treatment with light. Donor element 10 is positioned in a transfer relationship with substrate 36, that is, donor element 10 is placed in contact with substrate 36 or is held with a controlled separation from substrate 36. Substrate 36 can be an organic solid, an inorganic solid, or a combination of organic and inorganic solids that provides a surface for receiving the emissive material from a donor. Substrate 36 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 36 can be a homogeneous mixture of materials, a composite of materials, or multiple layers of materials. Substrate 36 can be an OLED substrate, that is a substrate commonly used for preparing OLED devices, e.g. active-matrix low-temperature polysilicon TFT substrate. The substrate 36 can either be light-transmissive or opaque, depending on the intended direction of light emission. The light-transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light-transmissive, light-absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices. Substrate 36 can be coated with other layers prior to this step. For example, substrate 36 can be previously coated with hole-transporting layer 43, which is coated onto a TFT, also called first electrode 41.

In this embodiment, donor element 10 has been prepared with radiation-absorbing layer 16, and is spaced from OLED substrate 36 by gap 44, which is maintained between donor element 10 and OLED substrate 36 by the structure of thin-film transistors 40 and intervening raised surface portions 42. It is understood that in other embodiments, gap 44 can be maintained in other ways, e.g. by the use of spacer elements on transfer surface 34 of donor element 10, as taught by Burberry et al. in commonly assigned U.S. patent application Ser. No. 10/060,837 filed Jan. 30, 2002 now abandoned, by Burberry et al., the disclosure of which is incorporated herein by reference. Gap 44 is provided with a vacuum or reduced pressure atmosphere in which the pressure is less than or equal to 1 torr, wherein the mean free path, which is the average distance traveled by gaseous molecules between collisions with other gaseous molecules, is greater than the gap distance. This means that material crossing the gap will have a low probability of colliding with any residual gases. A pattern of laser light 48 from laser source 28 illuminates non-transfer surface 32. Laser source 28 can be a visible-light laser or an infrared laser. Laser light 48 is absorbed by radiation-absorbing layer 16, which produces heat 50 in response to laser light 48. This heats organic material 30 in the immediate vicinity of laser light 48. In this embodiment, a large portion of the light impinging on donor 10 will be converted to heat, but this will only happen at selectively irradiated portions of donor 10. Some or all of the heated portion of organic material 30 undergoes vaporization transfer and is deposited on receiving surface 46 of OLED substrate 36 as transferred organic material 52 in a patterned transfer. Vaporization transfer is defined as the process whereby material is transported across a gap whether it is as individual molecules or small clusters of molecules. This can include processes such as sublimation, vaporization, and ablation. Organic material 30 is drawn for clarity as a single layer, but it will be understood that it can represent a multilayer coating as described herein. In particular, organic material 30 can comprise emissive layer 18 and hole-transporting layer 20 as previously described. It is preferable that the substrate hole-transporting layer 43 thickness be greater than the donor hole-transporting layer 20 thickness. In the case of a multilayer coating on a donor element, the hole-transporting material will be mixed into the emissive material at interface 24 between the hole-transporting and emissive materials.

Figure 2B:
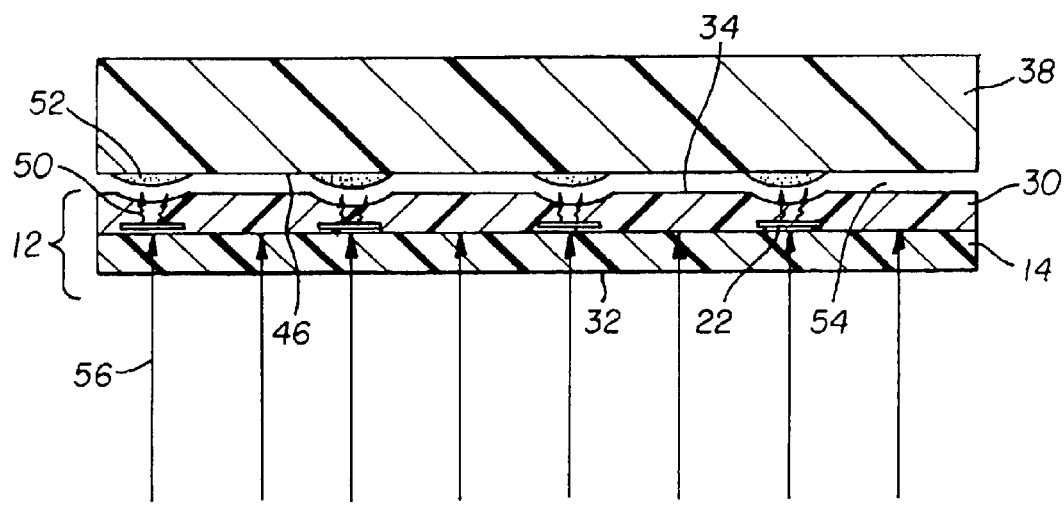
FIG. 2b shows a cross-sectional representation of the transfer of organic material from donor to substrate by another method of treatment with light.

FIG. 2b shows a cross-sectional representation of the transfer of organic material 30 from donor element 12 to portions of substrate 38 by another method of treatment with light. Donor element 12 is positioned in a transfer relationship with substrate 38. In this embodiment, donor element 12 has been prepared with light-absorbing layer 22 in a patterned layer, and is spaced from OLED substrate 38 by gap 54, which is provided by external means, e.g. spacers. Flash light 56 irradiates non-transfer surface 32. Flash light 56 illuminates light-absorbing material 22, which produces heat 50 in response to laser light 48. This heats organic material 30 in the immediate vicinity of light-absorbing layer 22 in a patterned layer. In this embodiment, only a portion of the light impinging on donor element 12 (i.e. that which impinges directly on light-absorbing layer 22) will be converted to heat. Some or all of the heated portion of organic material 30 is sublimed, vaporized, or ablated and is deposited on receiving surface 46 of OLED substrate 38 as transferred organic material 52 in a patterned transfer. Organic material 30 is drawn for clarity as a single layer, but it will be understood that it can represent a multilayer coating as described herein. In the case of a multilayer coating on a donor element, the hole-transporting material will be mixed into the emissive material at interface 24 between the hole-transporting and emissive materials.

Figure 3:
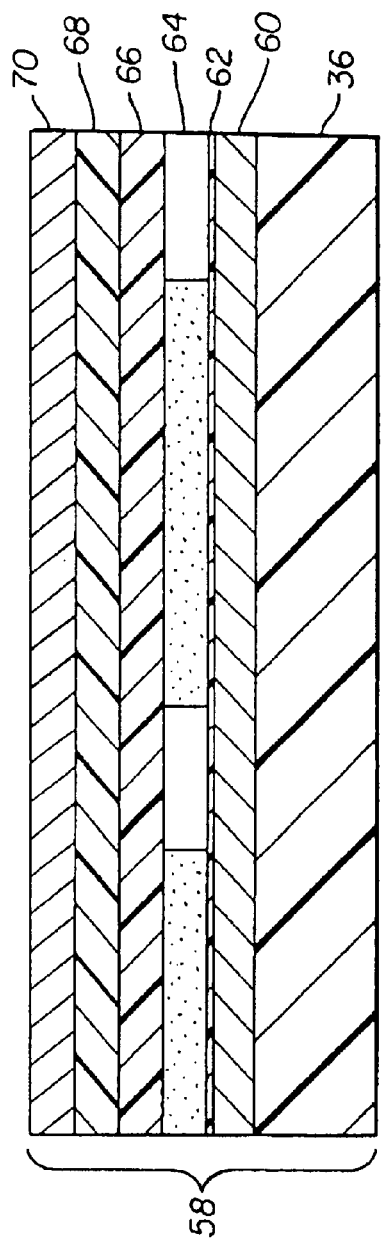
FIG. 3 shows a cross-sectional representation of the structure of an example OLED device.

Turning now to FIG. 3, there is shown in cross-sectional view an example of the structure of the emissive portion of an OLED device. OLED device 58 is formed on substrate 36, which is coated in the region of interest with anode layer 60. The conductive anode layer is formed over the substrate and, when EL emission is viewed through the anode, should be transparent or substantially transparent to the emission of interest. Common transparent anode materials used in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

OLED device 58 can further include hole-injecting layer 62. While not always necessary, it is often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, and plasma-deposited fluorocarbon polymers as described in U.S. Pat. No. 6,208,075. Alternative hole-injecting materials reportedly useful in organic EL devices are described in EP 0 891 121 A1 and EP 1,029,909 A1.

OLED device 58 further includes hole-transport layer 64. Hole-transport layer 64 can include any of the above-described hole-transport materials. Desired hole-transport materials can be deposited by any suitable means such as evaporation, sputtering, chemical vapor deposition, or electrochemical means. Hole-transport materials can be patterned using well known photolithographic processes.

OLED device 58 further includes emissive layer 66, which can include any of the above-described emissive materials and hole-transport materials as described herein. Emissive layer 66 is deposited by the techniques of this invention.

OLED device 58 further includes electron-transport layer 68. Desired electron-transport materials can be deposited by any suitable means such as evaporation, sputtering, chemical vapor deposition, or electrochemical means. Electron-transport materials can be patterned using well known photolithographic processes. Preferred electron transport materials for use in organic EL devices of this invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (G) are also useful electron transporting materials.

Other electron-transport materials can be polymeric substances, e.g. polyphenylenevinylene derivatives, poly-para-phenylene derivatives, polyfluorene derivatives, polythiophenes, polyacetylenes, and other conductive polymeric organic materials such as those listed in commonly assigned U.S. Pat. No. 6,221,553 B1 and references therein.

OLED device 58 further includes cathode 70. When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Figure 4:
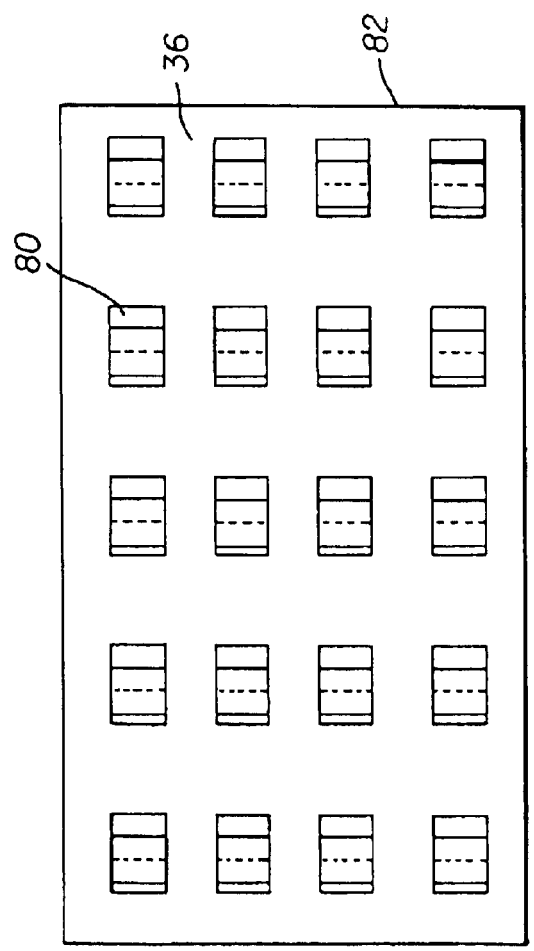
FIG. 4 shows a plan view of a substrate prepared in accordance with this invention.

Turning now to FIG. 4, and referring also to FIG. 2a, and 2b, there is shown a plan view of treated substrate 82, which has been treated in the manner described in this invention. Predetermined portions of organic material 30 have been transferred to substrate 36 in transferred pattern 80. Transferred pattern 80 has been formed in a manner consistent with the end-use of treated substrate 82 (e.g. transferred pattern 80 is of an OLED light-emissive material that has been transferred to the positions of existing thin-film transistors on substrate 36). Transferred pattern 80 reflects the method used to prepare it (e.g. radiation-absorbing material 22 in a patterned layer in FIG. 2b or the pattern of laser light 48 irradiation in FIG. 2a).

The invention and its advantages can be better appreciated by the following comparative examples.

EXAMPLE 1

An OLED device was constructed from a comparative donor element in the following manner:
1. Onto a polyimide donor support element film having a thickness of 104 microns, a coating of 60 nm of chromium metal was evaporatively deposited.
2. A further coating of 20 nm of 2-tert-butyl-9,10-bis(2-naphthyl)anthracene (TBADN) was evaporatively deposited on the above donor support element. A further coating of 0.15 nm of green dopant I was then evaporatively deposited on top of the TBADN layer.
3. A clean glass substrate was vacuum-deposited with indium tin oxide (ITO) through a mask to form a pattern of transparent electrodes of 40 to 80 nm thickness.
4. The above-prepared ITO surface was treated with a plasma oxygen etch, followed by plasma deposition of a 0.1 nm layer of a fluorocarbon polymer ($CF_x$) as described in U.S. Pat. No. 6,208,075.
5. The above-prepared substrate was further treated by vacuum-depositing a 75 nm layer of 4,4'-bis[N-(1-naphthyl)-N-phenylamino]biphenyl (NPB) as a hole-transport layer.
6. The coated side of the donor element prepared in step 2 was placed in contact with the treated side of the substrate prepared in step 5 and held in proximal contact using vacuum. A small gap was maintained by a 75-micron spacer.
7. Transfer of the emissive layer from the donor element to the substrate was effected by irradiation of the donor element with an infrared laser beam. The beam size was approximately 16 microns by 80 microns to the $1/e^2$ intensity point. The scanning was parallel to the wide beam direction. The dwell time was 27 microseconds with a power density of ~0.53 $J/cm^2$. Transfer was effected by selectively irradiating only the desired emissive regions.
8. A 35 nm electron-transport layer of tris(8-quinolinolato) aluminum (III) (ALQ) was vacuum-deposited onto the substrate at a coating station that included a heated tantalum boat source.
9. A 220 nm cathode layer was deposited onto the receiver element at a coating station with separate tantalum boats, one of which contained silver and one of which contained magnesium. The cathode layer was a 10:1 atomic ratio of magnesium and silver.

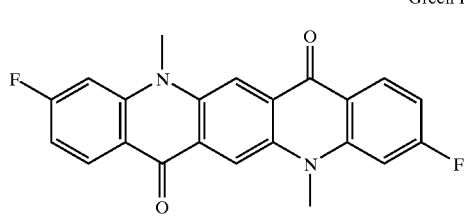

Green Dopant I

EXAMPLE 2

An OLED device was constructed from a donor element satisfying the requirements of the invention in the manner described in Example 1, except that after step 2, a further layer of 0.8 nm NPB was evaporatively deposited onto the donor element. Following this additional coating, the donor element was used in the subsequent steps of Example 1.

EXAMPLE 3

An OLED device was constructed from a comparative donor element in the manner described in Example 1, except step 2 was performed as follows:
2. A further coating of 8.5 nm of ALQ was evaporatively deposited on the above donor support element. A further coating of 0.2 nm of 4-(dicyano-methylene)-2-t-butyl-6-(1,1,7,7-tetramethyljulolidyl-9-enyl)-4H-pyran (DCJTB) was then evaporatively deposited on top of the ALQ layer. A further layer of 8.5 nm of TBADN was evaporatively deposited on top of the DCJTB layer.

EXAMPLE 4

An OLED device was constructed from a donor element satisfying the requirements of the invention in the manner described in Example 3, except that after step 2, a further layer of 0.8 nm NPB was evaporatively deposited onto the donor element. Following this additional coating, the donor element was used in the subsequent steps of Example 3.

EXAMPLE 5

An OLED device was constructed from a donor element satisfying the requirements of the invention in the manner described in Example 3, except that after step 2, a further layer of 0.8 nm hole-transporting material 1 (HTM-1) was evaporatively deposited onto the donor element. Following this additional coating, the donor element was used in the subsequent steps of Example 3.

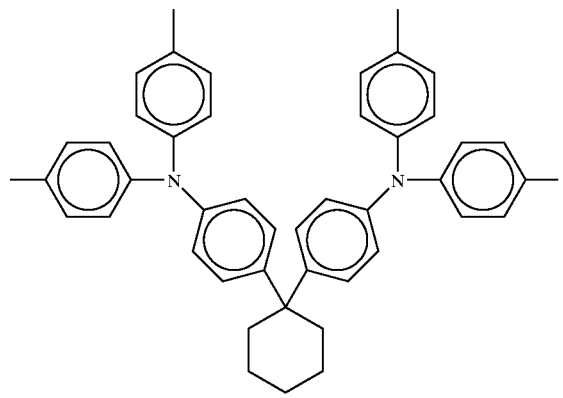

HTM-1

EXAMPLE 6

An OLED device was constructed from a donor element satisfying the requirements of the invention in the manner described in Example 3, except that after step 2, a further layer of 5.0 nm HTM-1 was evaporatively deposited onto the donor element. Following this additional coating, the donor element was used in the subsequent steps of Example 3.

EXAMPLE 7

An OLED device was constructed from a comparative donor element in the manner described in Example 1, except step 2 was performed as follows:
2. A further coating of 20 nm of TBADN was evaporatively deposited on the above donor support element. A further coating of 0.25 nm of tetra(t-butyl)perylene (TBP) was then evaporatively deposited on top of the ALQ layer.

EXAMPLE 8

An OLED device was constructed from a donor element satisfying the requirements of the invention in the manner described in Example 7, except that after step 2, a further layer of 0.8 nm NPB was evaporatively deposited onto the donor element. Following this additional coating, the donor element was used in the subsequent steps of Example 7.

Results

The devices were tested by applying a current across the electrodes of 20 ma/cm$^2$ and measuring the spectrum. The intensity was then monitored as a function of time at constant current. The following table shows the results.

| Example | Emissive Layer (nm) | Hole Layer (nm) | Peak Wavelength (nm) | Radiance (W/Sr/m$^2$) | Voltage at 20 ma/cm$^2$ | Time to 50% Intensity at 20 ma/cm$^2$ (hr) |
|---|---|---|---|---|---|---|
| 1 | 20 nm TBADN<br>0.15 nm Green Dopant I<br>(comparison) | none | 512 | 2.0 | 8.7 | Not tested |
| 2 | 20 nm TBADN<br>0.15 nm Green Dopant I<br>(invention) | 0.8 NPB | 512 | 2.2 | 8.2 | Not tested |
| 3 | 8.5 nm ALQ<br>0.2 nm DCJTB<br>8.5 nm TBADN<br>(comparison) | none | 616 | 2.2 | 7.6 | 45 |
| 4 | 8.5 nm ALQ<br>0.2 nm DCJTB<br>8.5 nm TBADN<br>(invention) | 0.8 NPB | 612 | 1.2 | 7.9 | 90 |
| 5 | 8.5 nm ALQ<br>0.2 nm DCJTB<br>8.5 nm TBADN<br>(invention) | 0.8 HTM-1 | 612 | 2.2 | 7.0 | 225 |
| 6 | 8.5 nm ALQ<br>0.2 nm DCJTB<br>8.5 nm TBADN<br>(invention) | 5 HTM-1 | 604 | 1.7 | 6.8 | 300 |
| 7 | 20 nm TBADN<br>0.25 nm TBP<br>(comparison) | none | 464 | 1.1 | 7.8 | Not tested |
| 8 | 20 nm TBADN<br>0.25 nm TBP<br>(invention) | 0.8 NPB | 464 | 1.5 | 7.9 | Not tested |

It is evident that the hole-transporting layer always increased stability in the samples tested. The radiance usually increased and the drive voltage generally decreased with the application of the thin hole-transporting layer. Increased stability is paramount, but increased efficiency, through lower drive voltage or higher radiance, is also desired and can be accomplished with this invention. The effect depends upon the choice of materials.

The invention has been described in detail with particular reference to certain preferred embodiments thereof, but it will be understood that variations and modifications can be effected within the spirit and scope of the invention.

PARTS LIST 10 donor element
12 donor element
14 donor support element
16 radiation-absorbing layer
18 emissive layer
20 hole-transporting layer
22 light-absorbing layer
24 interface
28 laser source
30 organic material
32 non-transfer surface
34 transfer surface
36 substrate
38 substrate
40 thin-film transistor
41 first electrode
42 raised surface portion
43 hole-transporting layer
44 gap
46 receiving surface
48 laser light
50 heat
52 transferred organic material
54 gap
56 flash light
58 OLED device
60 anode layer
62 hole-injecting layer
64 hole-transport layer
66 emissive layer
68 electron-transport layer
70 cathode
80 transferred pattern
82 treated substrate

What is claimed is:

1. A donor element adapted for use in making an OLED device, comprising:
   a) a donor support substrate;
   b) a light-absorbing layer disposed over the substrate which, in response to light, produces heat;
   c) an emissive layer disposed over the light-absorbing layer; and
   d) a hole-transporting layer having a thickness in a range from 0.1 nm to 5.0 nm disposed directly on the emissive layer such that when the donor element is positioned in a transfer relationship with the OLED device and when light is absorbed by the light-absorbing layer, heat is produced that causes the vaporization transfer across a gap of the hole-transporting layer and the emissive layer to the OLED device.

2. The donor element of claim 1 wherein the emissive layer includes a host material and a dopant.

3. The donor element of claim 1 wherein the hole-transporting layer is 4,4'-bis[N-(1-naphthyl)-N-phenylamino]biphenyl.

4. A method of using the donor element of claim 1 in a process of making an OLED device, comprising the steps of:
   a) positioning the donor element in a transfer relationship with an OLED substrate and spaced from such OLED substrate by a gap;
   b) providing a reduced pressure atmosphere in the gap between the donor element and the OLED substrate and wherein the reduced pressure atmosphere is less than or equal to 1 torr such that the mean free path is greater than the gap between the donor element and the substrate; and
   c illuminating the donor element with light which is sufficient to cause enough heal to be formed such that the hole-transporting layer and the emissive layer are respectively deposited on the OLED substrate with hole-transporting material of the hole-transporting layer being mixed into the emissive material of the emissive layer at the interface between the hole-transporting and emissive materials.

5. The method of claim 4 wherein the light is provided by a laser scarce.

6. The method of claim 5 wherein the laser light is from an infrared laser.

7. A method of using the donor element of claim 6 in a process of making an OLED device, comprising the steps of:
   a) positioning the donor element in a transfer relationship with an OLED substrate and spaced from such OLED substrate by a gap;
   b) providing a reduced pressure atmosphere in the gap between the donor element and the OLED substrate and wherein the reduced pressure atmosphere is less than or equal to 1 torr such that the mean free path is greater than the a gap between the donor element and the substrate; and
   c) illuminating the donor element with tight which is sufficient to cause enough heat to be formed such that the hole-transporting layer and the emissive layer are respectively deposited on the OLED substrate with hole-transporting material of the hole-transporting layer being mixed into the emissive materials of the emissive layer at the interface between the hole-transporting and emissive materials.

8. The method of claim 7 wherein the light is provided by a laser source.

9. The method of claim 8 wherein the laser light is from an infrared laser.

10. The method of claim 7 wherein the OLED substrate comprises a first electrode and a hole-transporting layer, where the substrate bole-transporting layer thickness is greater than the donor hole-transporting layer thickness.

* * * * *

UNITED STATES PATENT AND TRADEMARK OFFICE
CERTIFICATE OF CORRECTION

PATENT NO.   : 6,890,627 B2
DATED        : May 10, 2005
INVENTOR(S)  : Mitchell S. Burberry et al.

It is certified that error appears in the above-identified patent and that said Letters Patent is hereby corrected as shown below:

Column 21,
Line 24, "heal" should be -- heat --

Signed and Sealed this

Nineteenth Day of July, 2005

JON W. DUDAS
*Director of the United States Patent and Trademark Office*